(12) United States Patent
Tange et al.

(10) Patent No.: US 9,917,228 B2
(45) Date of Patent: Mar. 13, 2018

(54) SEMICONDUCTOR OPTICAL DEVICE

(71) Applicant: Sony Corporation, Tokyo (JP)

(72) Inventors: Takashi Tange, Kanagawa (JP);
Tatsushi Hamaguchi, Kanagawa (JP);
Masaru Kuramoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/317,341

(22) PCT Filed: Apr. 17, 2015

(86) PCT No.: PCT/JP2015/061811
§ 371 (c)(1),
(2) Date: Dec. 8, 2016

(87) PCT Pub. No.: WO2016/006298
PCT Pub. Date: Jan. 14, 2016

(65) Prior Publication Data
US 2017/0141267 A1    May 18, 2017

(30) Foreign Application Priority Data

Jul. 7, 2014  (JP) ................................. 2014-139340

(51) Int. Cl.
*H01L 27/15*  (2006.01)
*H01L 31/12*  (2006.01)
(Continued)

(52) U.S. Cl.
CPC .......... *H01L 33/32* (2013.01); *H01L 33/0075* (2013.01); *H01L 33/06* (2013.01);
(Continued)

(58) Field of Classification Search
CPC ......... H01L 33/32; H01L 33/42; H01L 33/16; H01L 33/06; H01L 33/0075

USPC ................................. 257/96, 102, 76, 79, 86
See application file for complete search history.

(56) References Cited

U.S. PATENT DOCUMENTS 7,193,249 B2 * 3/2007 Seong ............... H01L 21/28575
257/102
2005/0082557 A1    4/2005 Seong et al.
(Continued)

FOREIGN PATENT DOCUMENTS

JP    H10-154829 A    6/1998
JP    H10-242587 A    9/1998
(Continued)

OTHER PUBLICATIONS

International Search Report (with English translation) dated Jun. 30, 2015 in corresponding international application No. PCT/JP2015/061811 (5 pages).
Written Opinion dated Jun. 30, 2015 in corresponding international application No. PCT/JP2015/061811 (8 pages).

*Primary Examiner* — Thien F Tran
(74) *Attorney, Agent, or Firm* — K&L Gates LLP

(57) ABSTRACT

A semiconductor optical device has a multilayer structure 30 including a first compound semiconductor layer 31, an active layer 33, and a second compound semiconductor layer 32. A second electrode 42 is formed on the second compound semiconductor layer 32 through a contact layer 34. The contact layer 34 has a thickness of four or less atomic layers. When an interface between the contact layer 34 and the second compound semiconductor layer 32 is an xy-plane, a lattice constant along an x-axis of crystals constituting an interface layer 32A which is a part of the second compound semiconductor layer in contact with the contact layer 34 is $x_2$, a lattice constant along a z-axis is $z_2$, a length along an x-axis in one unit of crystals constituting the contact layer 34 is $x_c'$, and a length along the z-axis is $z_c'$, $(z_c'/x_c')>(z_2/x_2)$ is satisfied.

10 Claims, 4 Drawing Sheets

(51) Int. Cl.
  *H01L 33/00* (2010.01)
  *H01L 33/32* (2010.01)
  *H01L 33/42* (2010.01)
  *H01L 33/16* (2010.01)
  *H01S 5/042* (2006.01)
  *H01S 5/343* (2006.01)
  *H01L 33/06* (2010.01)

(52) U.S. Cl.
  CPC .............. *H01L 33/16* (2013.01); *H01L 33/42* (2013.01); *H01S 5/0425* (2013.01); *H01S 5/34333* (2013.01); *H01S 2304/04* (2013.01)

(56) References Cited

U.S. PATENT DOCUMENTS

| | | |
|---|---|---|
| 2009/0008648 A1 | 1/2009 | Biwa et al. |
| 2009/0201960 A1* | 8/2009 | Numata ................ B82Y 20/00 372/43.01 |
| 2012/0032209 A1* | 2/2012 | Shioda ................... H01L 33/04 257/94 |

FOREIGN PATENT DOCUMENTS

| | | |
|---|---|---|
| JP | 2000-164512 A | 6/2000 |
| JP | 2004-134772 A | 4/2004 |
| JP | 2005-123631 A | 5/2005 |
| JP | 2009-016467 A | 1/2009 |
| JP | 2010-129581 A | 6/2010 |
| JP | 2012-079967 A | 4/2012 |
| JP | 2012-142444 A | 7/2012 |

* cited by examiner

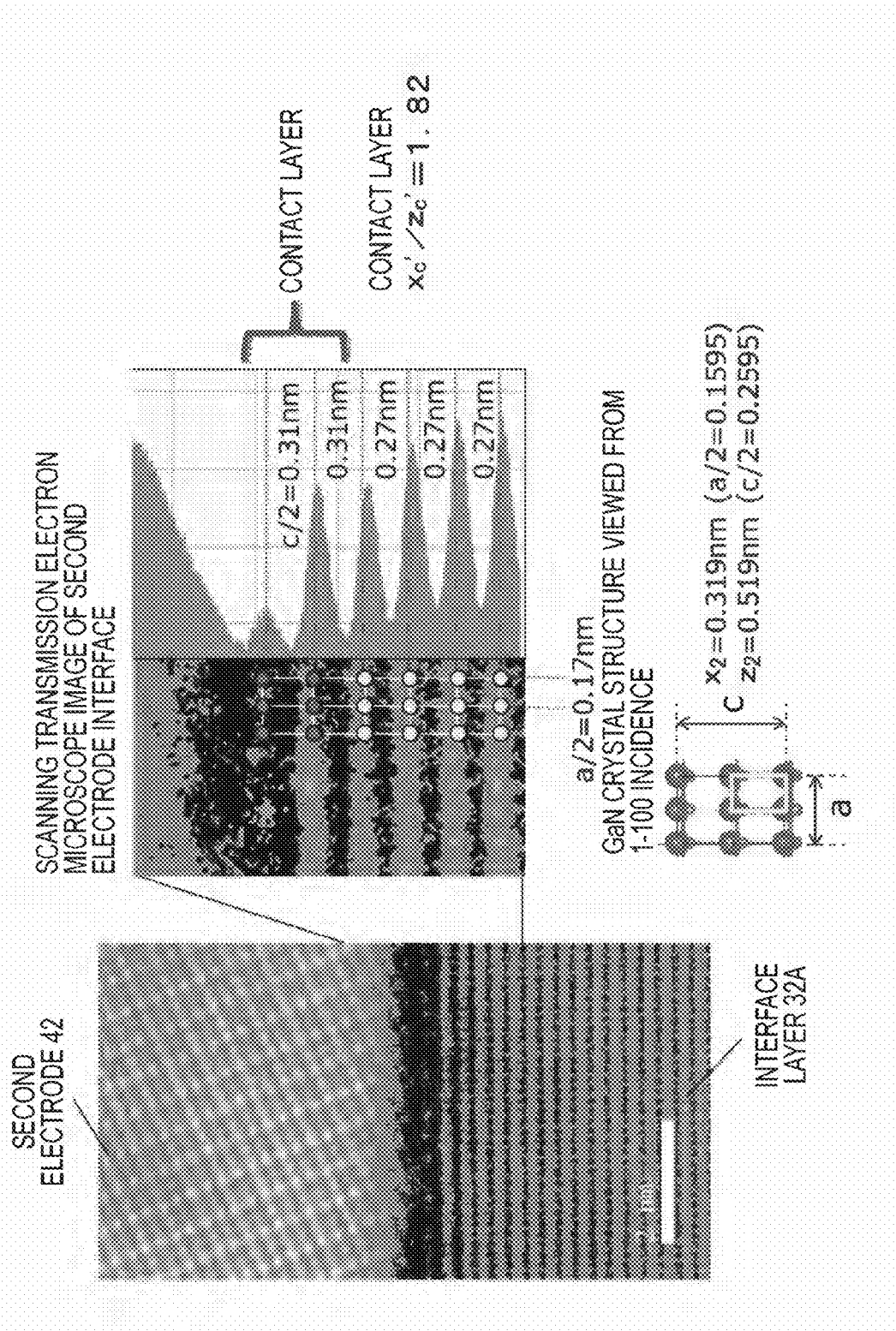

SEMICONDUCTOR OPTICAL DEVICE

CROSS-REFERENCE TO RELATED APPLICATIONS

The present application claims the benefit of International Application No. PCT/JP2015/061811, filed Apr. 17, 2015, which claims priority to Japanese Application No. 2014-139340, filed Jul. 7, 2014, the disclosures of which are incorporated herein by reference.

BACKGROUND

The present disclosure relates to a semiconductor optical device.

For example, a semiconductor optical device represented by a semiconductor laser element or a light-emitting diode has a multilayer structure including a first compound semiconductor layer having a first conductivity type, an active layer, and a second compound semiconductor layer having a second conductivity type different from the first conductivity type. A second electrode is formed on the second compound semiconductor layer. The first compound semiconductor layer is electrically connected to a first electrode.

FIG. 5 (Source: Ishikawa et al., J. Appl. Phys. 81. 1315 (1997)) illustrates a relationship between a metal constituting a second electrode (p-side electrode) formed on a second compound semiconductor layer formed of p-type GaN and a resistance value. Incidentally, a black circle indicates a value before an annealing treatment, and a white circle indicates a value after an annealing treatment at 500° C. A metal having a larger work function value used as the second electrode with respect to the second compound semiconductor layer formed of p-type GaN has a lower Schottky barrier, and therefore tends to obtain a better contact characteristic. FIG. 5 indicates that a resistance value is reduced according to increase in a work function value of a metal. Therefore, in general, a platinum group metal such as Pd or Pt, Ni, Au, or the like having a work function value distributed in a range of 5 eV to 5.65 eV is used as an ohmic electrode with respect to the second compound semiconductor layer formed of p-type GaN.

For example, JP 10-242587 A discloses a nitride semiconductor element for reducing a driving voltage. This nitride semiconductor element includes a p-type electrode formed on a p-type nitride semiconductor layer through a p-type contact layer. In addition, the p-type contact layer is formed of a p-type nitride semiconductor having a smaller band gap energy than the p-type nitride semiconductor layer, and has a thickness of 50 nm or less.

CITATION LIST

Patent Document

Patent Document 1: JP 10-242587 A

SUMMARY

Problems to be Solved by the Invention

However, even in the technique disclosed in this patent publication, a material having a high work function value, such as an alloy containing Ni and Au, Pd/Au, Pd/Pt/Au, or Pd/Ag/Au, is used for a material constituting the second electrode. That is, the degree of freedom for selecting a material constituting the second electrode is low disadvantageously.

Therefore, an object of the present disclosure is to provide a semiconductor optical device having a configuration and a structure capable of reducing a driving voltage and improving the degree of freedom for selecting a material constituting the second electrode.

Solutions to Problems

A semiconductor optical device according to a first aspect of the present disclosure for achieving the above object has a multilayer structure including a first compound semiconductor layer having a first conductivity type, an active layer, and a second compound semiconductor layer having a second conductivity type different from the first conductivity type.

A second electrode is formed on the second compound semiconductor layer through a contact layer.

The contact layer has a thickness of four or less atomic layers.

When an interface between the contact layer and the second compound semiconductor layer is an xy-plane, a lattice constant along an x-axis of crystals constituting an interface layer which is a part of the second compound semiconductor layer in contact with the contact layer is $x_2$, a lattice constant along a z-axis is $z_2$, a length along the x-axis in one unit of crystals constituting the contact layer is $x_c'$, and a length along the z-axis is $z_c'$, $$(z_c'/x_c') > (z_2/x_2)$$

is satisfied.

A semiconductor optical device according to a second aspect of the present disclosure for achieving the above object has a multilayer structure including a first compound semiconductor layer having a first conductivity type, an active layer, and a second compound semiconductor layer having a second conductivity type different from the first conductivity type.

A first electrode is formed on the first compound semiconductor layer through a contact layer.

The contact layer has a thickness of four or less atomic layers.

When an interface between the contact layer and the first compound semiconductor layer is an xy-plane, a lattice constant along an x-axis of crystals constituting an interface layer which is a part of the first compound semiconductor layer in contact with the contact layer is $x_1$, a lattice constant along a z-axis is $z_1$, a length along the x-axis in one unit of crystals constituting the contact layer is $x_c''$, and a length along the z-axis is $z_c''$, $$(z_c''/x_c'') > (z_1/x_1)$$

is satisfied.

Effects of the Invention

In the semiconductor optical device according to the first or second aspect of the present disclosure, the lattice constant in the interface layer which is a part of the second compound semiconductor layer or the first compound semiconductor layer in contact with the contact layer, and the length in one unit of crystals constituting the contact layer satisfy a predetermined relationship, and therefore a kind of distortion is generated in the contact layer. As a result, it is possible not only to reduce a driving voltage but also to form the second electrode or the first electrode of a material having a low work function value. The degree of freedom for selecting a material constituting the second electrode or the first electrode can be improved. Incidentally, the effects described herein are merely illustrative, and are not restrictive. In addition, an additional effect may be present.

BRIEF DESCRIPTION OF DRAWINGS

FIG. 2 is a scanning transmission electron microscope image of the semiconductor optical device in Example 1.

DETAILED DESCRIPTION

Figure 1A:
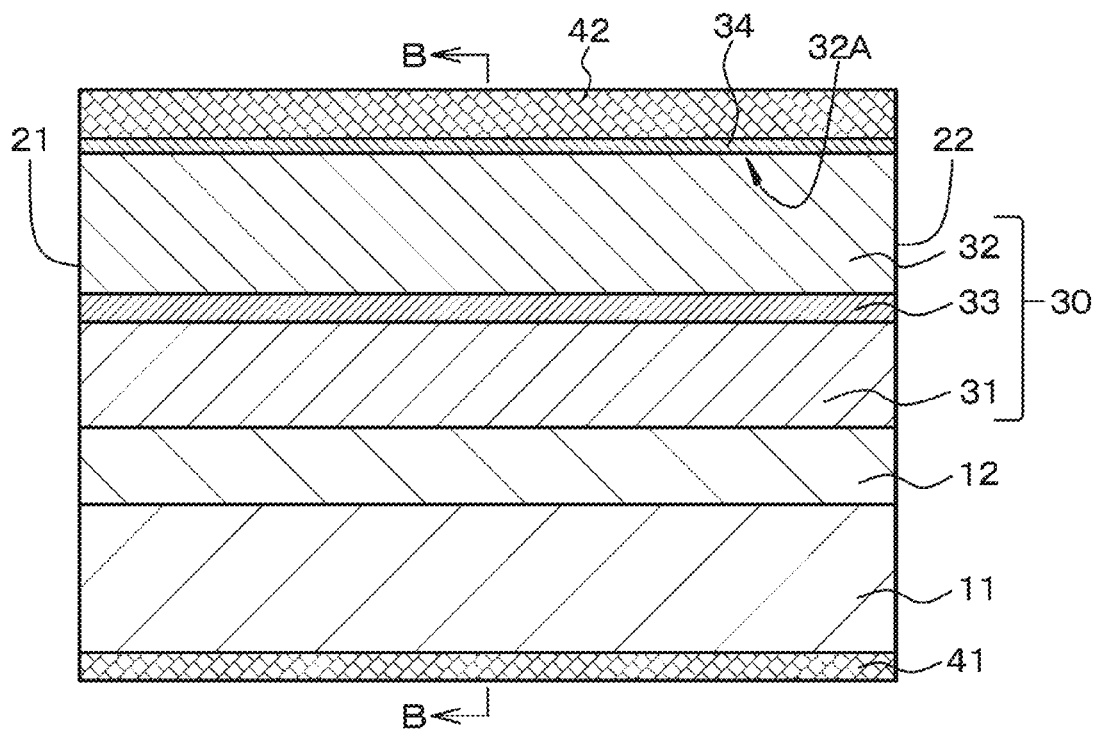
FIGS. 1A and 1B are schematic partial cross sectional views of a semiconductor optical device in Example 1.

Hereinafter, the present disclosure will be described on the basis of Examples with reference to the drawings. However, the present disclosure is not limited to Examples, but various numerical values and materials in Examples are illustrative. Incidentally, description will be made in the following order.

1. General description of semiconductor optical devices according to first and second aspects of the present disclosure
2. Example 1 (semiconductor optical device according to the first aspect of the present disclosure)
3. Example 2 (Modification of Example 1)
4. Example 3 (semiconductor optical device according to the second aspect of the present disclosure)
5. Others <General Description of Semiconductor Optical Devices According to First and Second Aspects of the Present Disclosure>

In semiconductor optical devices according to first and second aspects of the present disclosure, a contact layer has a thickness of four or less atomic layers. When the contact layer has a thickness of more than four atomic layers, a crystal defect is generated in the contact layer, and this may lead to increase in a contact resistance value. The contact layer may have a "layered shape" or an island shape without having a layered shape.

In the semiconductor optical device according to the first aspect of the present disclosure, the contact layer can be pseudomorphic with respect to an interface layer of a second compound semiconductor layer. Here, being pseudomorphic means that a value of $x_C'$ is equal to a value of $x_2$ and that a volume of one unit of crystals constituting the contact layer is equal to a volume determined from a lattice constant of crystals constituting the contact layer. That is, in the semiconductor optical device having such a form according to the first aspect of the present disclosure, when a lattice constant along an x-axis of crystals constituting the contact layer is $x_c$ and a lattice constant along a z-axis is $z_C$, $$x_2 = x_C' < x_C$$

and $$z_C' > z_C$$

can be satisfied. Incidentally, "$x_2 = x_C'$" includes not only a case where $x_2$ is strictly equal to $x_C'$ arithmetically but also a case where $$0.90 \le x_C'/x_2 \le 1.10$$

is satisfied.

In addition, in the semiconductor optical device according to the second aspect of the present disclosure, the contact layer can be pseudomorphic with respect to an interface layer of a first compound semiconductor layer. Here, being pseudomorphic means that a value of $x_C''$ is equal to a value of $x_1$ and that a volume of one unit of crystals constituting the contact layer is equal to a volume determined from a lattice constant of crystals constituting the contact layer. That is, in the semiconductor optical device having such a form according to the second aspect of the present disclosure, when a lattice constant along an x-axis of crystals constituting the contact layer is $x_c$ and a lattice constant along a z-axis is $z_C$, $$x_1 = x_C'' < x_C$$

and $$z_C'' > z_C$$

are satisfied. Incidentally, "$x_1 = x_C''$" includes not only a case where $x_1$ is strictly equal to $x_C''$ arithmetically but also a case where $$0.90 \le x_C''/x_1 \le 1.10$$

is satisfied.

In the semiconductor optical device according to the first aspect (or the second aspect) of the present disclosure including the above preferable forms, a crystal structure of crystals constituting the interface layer of the second compound semiconductor layer (or the first compound semiconductor layer) can be a hexagonal system. In addition, in such a configuration, a multilayer structure can be formed of a GaN-based compound semiconductor, and the contact layer can be formed of a GaN-based compound semiconductor having the same composition as a GaN-based compound semiconductor constituting the interface layer of the second compound semiconductor layer (or the first compound semiconductor layer), further containing an oxygen atom. Alternatively, the multilayer structure can be formed of a GaN-based compound semiconductor, and the contact layer can be formed of a GaN-based compound semiconductor having a different composition from the GaN-based compound semiconductor constituting the interface layer of the second compound semiconductor layer (or the first compound semiconductor layer). Here, in the latter case, specifically, the interface layer of the second compound semiconductor layer (or the first compound semiconductor layer) can be formed of a GaN layer, and examples of a configuration of the contact layer include:

(a) $Al_X Ga_Y In_Z N$ (provided that $X+Y+Z=1$, $0 \le X \le 1$, $0 \le Y \le 1$, and $0 \le Z \le 1$);

(b) $Al_X Ga_Y In_Z N_S O_T$ (provided that $X+Y+Z=1$, $0 \le X \le 1$, $0 \le Y \le 1$, $0 \le Z \le 1$, $0 < S \le 1$, and $0 < T \le 1$);

(c) $Al_X Ga_Y In_Z N_S P_{1-S}$ (provided that $X+Y+Z=1$, $0 \le X \le 1$, $0 \le Y \le 1$, $0 \le Z \le 1$, and $0 \le S < 1$);

(d) $Al_X Ga_Y In_Z N_S As_{1-S}$ (provided that $X+Y+Z=1$, $0 \le X \le 1$, $0 \le Y \le 1$, $0 \le Z \le 1$, and $0 \le S < 1$); and (e) $Al_X Ga_Y In_Z N_S Sb_{1-S}$ (provided that $X+Y+Z=1$, $0 \le X \le 1$, $0 \le Y \le 1$, $0 \le Z \le 1$, and $0 \le S < 1$). For example, it can be measured by an energy dispersive X-ray analysis method with a transmission electron microscope or a three-dimensional atom probe method whether a GaN-based compound semiconductor contains an oxygen atom.

Alternatively, in the semiconductor optical device according to the first or second aspect of the present disclosure including the above preferable forms, the multilayer structure can be formed of a GaN-based compound semiconductor, and the contact layer can be formed of one material selected from the group consisting of ZnO, ZnSe, CdO, CdS, and CdSe.

In the semiconductor optical device according to the first (or second) aspect of the present disclosure including the above preferable forms and configurations, a value of band gap energy of a compound semiconductor constituting the contact layer is preferably smaller than that of a compound semiconductor constituting the interface layer of the second compound semiconductor layer (or the first compound semiconductor layer).

Furthermore, in the semiconductor optical device according to the first (or second) aspect of the present disclosure including the above preferable forms and configurations, the second electrode (or the first electrode) is preferably formed of a transparent conductive material containing an indium atom.

Furthermore, in the semiconductor optical device according to the first (or second) aspect of the present disclosure including the above preferable forms and configurations, the first conductivity type can be n-type, and the second conductivity type can be p-type.

As described above, the multilayer structure or the contact layer is preferably formed of a GaN-based compound semiconductor. However, examples of a portion of the second compound semiconductor layer other than the interface layer of the second compound semiconductor layer, the active layer, and a compound semiconductor constituting the first compound semiconductor layer include a GaN-based compound semiconductor such as GaN, AlGaN, InGaN, or AlInGaN. Examples of a compound semiconductor constituting the active layer include InGaN and AlInGaN. Furthermore, these compound semiconductors may contain a boron (B) atom, a thallium (Tl) atom, an arsenic (As) atom, a phosphorus (P) atom, or an antimony (Sb) atom, if desired. Examples of a method for forming a multilayer structure (film-forming method) include a metal organic chemical vapor deposition method (MOCVD method or MOVPE method), a metal organic molecular beam epitaxy method (MOMBE method), a hydride vapor deposition method in which a halogen contributes to transportation or a reaction (HVPE method), and a plasma assisted physical vapor deposition method (PPD method). Here, examples of an organic gallium source in the MOCVD method include trimethyl gallium (TMG) and triethyl gallium (TEG). Examples of a nitrogen source include ammonia gas and hydrazine. In addition, when aluminum (Al) or indium (In) is contained as a constituent atom of the GaN-based compound semiconductor layer, it is only required to use trimethyl aluminum (TMA) as an Al source, and to use trimethyl indium (TMI) as an In source. Furthermore, it is only required to use monosilane ($SiH_4$) as a Si source, and to use cyclopentadienyl magnesium, methyl cyclopentadienyl magnesium, or biscyclopentadienyl magnesium ($Cp_2Mg$) as a Mg source. When a ridge stripe structure is formed from a multilayer structure including the first compound semiconductor layer, the active layer, and the second compound semiconductor layer, examples of a method for etching the multilayer structure to form the ridge stripe structure include a combination of a lithography technique and a wet etching technique and a combination of a lithography technique and a dry etching technique. The configuration of the multilayer structure itself can be a known configuration. The multilayer structure is formed on a substrate for manufacturing a semiconductor optical device (hereinafter, simply referred to as a "manufacturing substrate"), and has a structure obtained by stacking the first compound semiconductor layer, the active layer, and the second compound semiconductor layer or a structure obtained by stacking the second compound semiconductor layer, the active layer, and the first compound semiconductor layer from a side of the manufacturing substrate. Examples of a method for forming a contact layer include an atomic layer deposition method (ALD method), amigration-enhanced epitaxy method (MEE method), a pulsed laser deposition method (PLD method), and a heat treatment method in addition to the above method for forming a multilayer structure.

The active layer may be formed of a single compound semiconductor layer, or may have a single quantum well structure (SQW structure) or a multiple quantum well structure (MQW structure). The active layer having a quantum well structure has at least one well layer and at least one barrier layer stacked. However, examples of a combination of (a compound semiconductor constituting the well layer and a compound semiconductor constituting the barrier layer) include (InGaN, GaN), (InGaN, AlInGaN), and (InGaN, InGaN) [provided that the composition of InGaN constituting the well layer is different from that constituting the barrier layer]. Furthermore, the barrier layer may be formed of a group of layers having a plurality of compositions.

In order to impart a first conductivity type to the first compound semiconductor layer and to impart a second conductivity type to the second compound semiconductor layer and the contact layer, it is only required to introduce impurities into each of the first compound semiconductor layer, the second compound semiconductor layer, and the contact layer. Examples of n-type impurities added to the compound semiconductor layer include silicon (Si), sulfur (S), selenium (Se), germanium (Ge), tellurium (Te), tin (Sn), carbon (C), titanium (Ti), oxygen (O), and palladium (Pd). Examples of p-type impurities include zinc (Zn), magnesium (Mg), carbon (C), beryllium (Be), cadmium (Cd), calcium (Ca), and barium (Ba).

In the semiconductor optical device according to the first aspect of the present disclosure, the second electrode is in contact with the second compound semiconductor layer through the contact layer, and the first electrode is electrically connected to the first compound semiconductor layer. That is, the first electrode is formed on the first compound semiconductor layer, or is connected to the first compound semiconductor layer through a conductive material layer or the manufacturing substrate. In the semiconductor optical device according to the second aspect of the present disclosure, the first electrode is in contact with the first compound semiconductor layer through the contact layer, and the second electrode is formed on the second compound semiconductor layer. Incidentally, the second electrode can be in contact with the second compound semiconductor layer through the contact layer, and the first electrode can be in contact with the first compound semiconductor layer through a second contact layer.

When the first conductivity type is n-type and the second conductivity type is p-type, for example, the second electrode can have a single layer configuration or a multilayer configuration containing at least one metal (including an alloy) selected from the group consisting of titanium (Ti), aluminum (Al), tantalum (Ta), palladium (Pd), nickel (Ni), platinum (Pt), gold (Au), cobalt (Co), and rhodium (Rh). For example, the first electrode preferably has a single layer configuration or a multilayer configuration containing at least one metal (including an alloy) selected from the group consisting of gold (Au), silver (Ag), palladium (Pd), platinum (Pt), nickel (Ni), Al (aluminum), Ti (titanium), tungsten (W), vanadium (V), chromium (Cr), Cu (copper), Zn (zinc), tin (Sn), and indium (In). Example thereof include Ti/Au, Ti/Al, Ti/Pt/Au, Ti/Al/Au, Ti/Pt/Au, Ni/Au, Ni/Au/Pt, Ni/Pt, Pd/Pt, and Ag/Pd. Incidentally, the further forward a layer in "/" of the multilayer configuration is located, the closer to the active layer the layer is located. This applies to the following description similarly. For example, in the first electrode or the second electrode, a film can be formed by a PVD method such as a vacuum evaporation method or a sputtering method.

Alternatively, when the second electrode is formed on a second compound semiconductor layer having a p-conductivity type, as described above, the second electrode may be formed of a transparent conductive material layer. In addition, when the first electrode is formed on a first compound semiconductor layer having an n-conductivity type, the first electrode may be formed of a transparent conductive material layer. As described above, examples of the transparent conductive material constituting the transparent conductive material layer include a transparent conductive material containing an indium atom [specifically, indium oxide, indium-tin oxide (ITO, including Sn-doped $In_2O_3$, crystalline ITO, and amorphous ITO), indium-zinc oxide (IZO), indium-gallium composite oxide (IGO), indium-doped gallium-zinc composite oxide (IGZO, In—$GaZnO_4$), and IFO (F-doped $In_2O_3$)]. Examples thereof further include tin oxide ($SnO_2$), ATO (Sb-doped $SnO_2$), FTO (F-doped $SnO_2$), zinc oxide (ZnO, including Al-doped ZnO, B-doped ZnO, and Ga-doped ZnO), antimony oxide, a spinel-type oxide, and an oxide having a $YbFe_2O_4$ structure. Alternatively, examples of the first electrode or the second electrode include a transparent conductive material layer containing gallium oxide, titanium oxide, niobium oxide, nickel oxide, or the like as a base layer.

Alternatively, examples of a material constituting the first electrode or the second electrode, having an excellent light transmitting property and a small work function value include an alkaline earth metal such as calcium (Ca) or barium (Ba), an alkali metal such as lithium (Li) or cesium (Cs), indium (In), magnesium (Mg), silver (Ag), gold (Au), nickel (Ni), and gold-germanium (Au—Ge). Examples thereof further include an alkali metal oxide such as $Li_2O$, $Cs_2Co_3$, $Cs_2SO_4$, MgF, LiF, or $CaF_2$, an alkali metal fluoride, an alkaline earth metal oxide, and an alkaline earth fluoride.

A pad electrode may be disposed on the first electrode or the second electrode in order to connect the first electrode or the second electrode to an external electrode or circuit electrically. The pad electrode preferably has a single layer configuration or a multilayer configuration containing at least one metal (including an alloy) selected from the group consisting of titanium (Ti), aluminum (Al), platinum (Pt), gold (Au), nickel (Ni), and palladium (Pd). Alternatively, the pad electrode may have a multilayer configuration such as a Ti/Pt/Au multilayer configuration, a Ti/Au multilayer configuration, a Ti/Pd/Au multilayer configuration, a Ti/Pd/Au multilayer configuration, a Ti/Ni/Au multilayer configuration, or a Ti/Ni/Au/Cr/Au multilayer configuration.

The manufacturing substrate may remain, or the manufacturing substrate may be removed after the first compound semiconductor layer, the active layer, the second compound semiconductor layer, the contact layer, the second electrode, and the like are sequentially formed on the manufacturing substrate. Specifically, it is only required to form the first compound semiconductor layer, the active layer, the second compound semiconductor layer, the contact layer, and the second electrode sequentially on the manufacturing substrate, to fix the second electrode to a supporting substrate, and then to remove the manufacturing substrate to expose the first compound semiconductor layer. The manufacturing substrate can be removed on the basis of an etching method or a polishing method, or on the basis of a chemical/mechanical polishing method (CMP method). Incidentally, first, a part of the manufacturing substrate may be removed or the thickness of the manufacturing substrate may be reduced by a wet etching method using an alkali aqueous solution such as a sodium hydroxide aqueous solution or a potassium hydroxide aqueous solution, an ammonia solution+a hydrogen peroxide solution, a sulfuric acid solution+a hydrogen peroxide solution, a hydrochloric acid solution+a hydrogen peroxide solution, a phosphoric acid solution+a hydrogen peroxide solution, or the like, a dry etching method, a lift-off method using a laser, a mechanical polishing method, or the like, or a combination thereof. Subsequently, the first compound semiconductor layer may be exposed by a chemical/mechanical polishing method. In this case, in the semiconductor optical device according to the second aspect of the present disclosure, the contact layer and the first electrode may be formed sequentially on the exposed first compound semiconductor layer.

In the semiconductor optical device according to the first or second aspect of the present disclosure including the above preferable forms and configurations, light generated in the active layer can be emitted to the outside from an end surface (side surface) of the multilayer structure, can be emitted to the outside through the second compound semiconductor layer, or can be emitted to the outside through the first compound semiconductor layer. In the semiconductor optical device in which light is emitted to the outside from a side of the first compound semiconductor layer, in some cases, the manufacturing substrate may be removed as described above.

In addition to a GaN substrate and a sapphire substrate, examples of the manufacturing substrate include a GaAs substrate, a SiC substrate, an alumina substrate, a ZnS substrate, a ZnO substrate, an AlN substrate, a LiMgO substrate, a $LiGaO_2$ substrate, a $MgAl_2O_4$ substrate, an InP substrate, a Si substrate, and a substrate having an underlying layer or a buffer layer formed on a surface (main surface) of each of these substrates. Mainly, when a GaN-based compound semiconductor layer is formed on a substrate, a GaN substrate is preferable due to a small defect density. However, it is known that the GaN substrate changes characteristics thereof among polar/non-polar/semi-polar according to a growth stage thereof.

Alternatively, in addition to the above various substrates, examples of the manufacturing substrate include a transparent inorganic substrate such as a glass substrate or a quartz substrate, and a transparent plastic substrate or film such as a polyester resin including polyethylene terephthalate (PET) and polyethylene naphthalate (PEN); a polycarbonate (PC) resin; a polyether sulfone (PES) resin; a polyolefin resin including polystyrene, polyethylene, and polypropylene; a polyphenylene sulfide resin; a polyvinylidene fluoride resin; a tetraacetyl cellulose resin; a brominated phenoxy resin; an aramid resin; a polyimide resin; a polystyrene resin; a polyarylate resin; a polysulfone resin; an acrylic resin; an epoxy resin; a fluorocarbon resin; a silicone resin; a diacetate resin; a triacetate resin; a polyvinyl chloride resin; or a cyclic polyolefin resin. Examples of the glass substrate include a soda glass substrate, a heat-resistant glass substrate, and a quartz glass substrate.

For example, it is only required to form the supporting substrate of various substrates such as a GaN substrate, a sapphire substrate, a GaAs substrate, a SiC substrate, an alumina substrate, a ZnS substrate, a ZnO substrate, a LiMgO substrate, a LiGaO$_2$ substrate, a MgAl$_2$O$_4$ substrate, and an InP substrate. Alternatively, the supporting substrate can be formed of an insulating substrate formed of AlN or the like, a semiconductor substrate formed of Si, SiC, Ge, or the like, a metal substrate, or an alloy substrate. However, it is preferable to use a conductive substrate. Alternatively, it is preferable to use a metal substrate or an alloy substrate from a viewpoint of a mechanical characteristic, elastic deformation, a plastic deformation property, a heat radiation property, or the like. As the thickness of the supporting substrate, 0.05 mm to 0.5 mm can be exemplified. As a method for fixing the second electrode to the supporting substrate, a known method such as a solder bonding method, a room temperature bonding method, a bonding method using an adhesive tape, or a bonding method using wax bonding can be used. However, the solder bonding method or the room temperature bonding method is desirably employed from a viewpoint of ensuring conductivity. For example, when a silicon semiconductor substrate which is a conductive substrate is used as a supporting substrate, a method capable of bonding at a low temperature of 400° C. or lower is desirably employed in order to suppress warpage due to a difference in a thermal expansion coefficient. When a GaN substrate is used as a supporting substrate, a bonding temperature may be 400° C. or higher.

Examples of the semiconductor optical device according to the first or second aspect of the present disclosure including the above preferable forms include a light emitting and receiving element. Specific examples thereof include a semiconductor light emitting element such as an edge-emitting type semiconductor laser element, an edge-emitting type superluminescent diode (SLD), a surface emitting laser element (vertical cavity surface emitting laser, also referred to as VCSEL), or a light emitting diode (LED), a semiconductor light amplifier, a solar cell, and a light sensor. The semiconductor optical amplifier does not convert an optical signal into an electrical signal, but amplifies the optical signal in a state of direct light, has a laser structure in which a resonator effect has been eliminated as much as possible, and amplifies incident light on the basis of optical gain of the semiconductor optical amplifier. In the semiconductor laser element, by optimizing a relationship between optical reflectances on the first end surface and the second end surface, a resonator is formed, and light is emitted from the first end surface. Alternatively, an external resonator may be disposed. On the other hand, in the superluminescent diode, the optical reflectance on the first end surface is set to a very low value, the optical reflectance on the second end surface is set to a very high value, a resonator is not formed, light generated in the active layer is reflected on the second end surface, and the light is emitted from the first end surface. In the semiconductor laser element and the superluminescent diode, a non-reflection coating layer (AR) or a low-reflection coating layer is formed on the first end surface, and a high-reflection coating layer (HR) is formed on the second end surface. In addition, in the semiconductor optical amplifier, the optical reflectance on the first end surface or the second end surface is set to a very low value, a resonator is not formed, light incident from the second end surface is amplified, and the light is emitted from the first end surface. In the surface emitting laser element, laser oscillation occurs by resonating light between two light reflecting layers (distributed Bragg reflector layers (DBR layers)).

In general, a non-reflection coating layer (AR) or a low-reflection coating layer is formed on a light emitting end surface or a light incident end surface. In addition, a high-reflection coating layer (HR) is formed on a light reflecting end surface. Examples of the non-reflection coating layer (low-reflection coating layer) include a stacked structure of at least two layers selected from the group consisting of a titanium oxide layer, a tantalum oxide layer, a zirconium oxide layer, a silicon oxide layer, an aluminum oxide layer, an aluminum nitride layer, and a silicon nitride layer. The non-reflection coating layer (low-reflection coating layer) can be formed on the basis of a PVD method such as a sputtering method or a vacuum evaporation method.

The semiconductor laser element is not limited. However, examples thereof include a semiconductor laser element having a ridge stripe type separate confinement heterostructure (SCH structure). Examples thereof further include a semiconductor laser element having a diagonal ridge stripe type separate confinement heterostructure. That is, an axis of the semiconductor laser element and an axis of the ridge stripe structure can intersect each other at a predetermined angle. Here, a predetermined angle $\phi$ can satisfy $0.1° \leq \phi \leq 10°$, for example. The axis of the ridge stripe structure is a straight line connecting a bisection point of both ends of the ridge stripe structure on a light emitting end surface and a bisection point of both ends of the ridge stripe structure on a light reflecting end surface. In addition, the axis of the semiconductor laser element means an axis perpendicular to a virtual vertical plane on the light emitting end surface and a virtual vertical plane on the light reflecting end surface. The planar shape of the ridge stripe structure may be linear or curved. Examples of the semiconductor laser element further include a semiconductor laser element having a tapered (flared) ridge stripe type separate confinement heterostructure (for example, including a configuration in which the shape is gradually widened monotonically in a tapered shape from a light emitting end surface toward a light reflecting end surface, and a configuration in which the shape is first widened from a light emitting end surface toward a light reflecting end surface, and then is narrowed after the width becomes larger than a maximum width). The ridge stripe structure may be formed of a part of the second compound semiconductor layer in a thickness direction thereof, may be formed of the second compound semiconductor layer and the active layer, or may be formed of the second compound semiconductor layer, the active layers, and a part of the first compound semiconductor layer in a thickness direction thereof. However, the structure of the semiconductor laser element is not limited to these structures. Examples of the semiconductor laser element further include a semiconductor laser element having an index/guide structure, a bi section type or multi section type (multi-electrode type) semiconductor laser element in which a light-emitting region and a saturable absorption region are juxtaposed in a resonator direction, a saturable absorber layer (SAL) type semiconductor laser element in which a light-emitting region and a saturable absorption region are disposed in a vertical direction, and a weakly index guide (WI) type semiconductor laser element provided with a saturable absorption region along a ridge stripe structure.

For example, the semiconductor optical device or the like according to the first or second aspect of the present disclosure can be applied to a display device. That is, examples of such a display device include a projector device, an image display device, and a monitor device including the semiconductor optical device or the like according to the first or second aspect of the present disclosure as a light source, and a reflection type liquid crystal display device, a head mounted display (HMD), a head-up display (HUD), and various kinds of illumination including the semiconductor optical device or the like according to the first or second aspect of the present disclosure as a light source. In addition, the semiconductor optical device or the like according to the first or second aspect of the present disclosure can be used as a light source of a microscope. However, an application field of the semiconductor optical device according to the first or second aspect of the present disclosure is not limited thereto.

Example 1

Figure 1B:
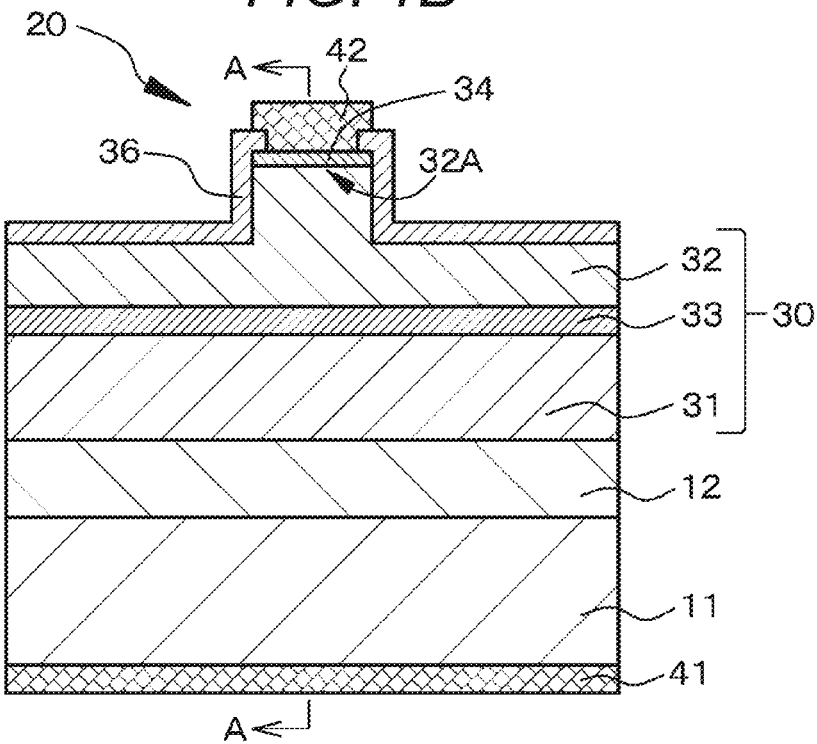

Example 1 relates to a semiconductor optical device according to the first aspect of the present disclosure. FIGS. 1A and 1B illustrate schematic partial cross sectional views of the semiconductor optical device in Example 1. Incidentally, FIG. 1A is a schematic partial cross sectional view cut along the arrow A-A in FIG. 1B, and is a schematic partial cross sectional view obtained by cutting the semiconductor optical device at a virtual plane perpendicular to a direction in which a waveguide structure (resonator structure) extends. In addition, FIG. 1B is a schematic partial cross sectional view cut along an arrow B-B in FIG. 1A, and is a schematic partial cross sectional view obtained by cutting the semiconductor optical device at a virtual plane parallel to a direction in which a waveguide structure (resonator structure) extends.

The semiconductor optical device in Example 1 or Example 2 or 3 described below is specifically formed of a semiconductor laser element, and is more specifically formed of a semiconductor laser element having a ridge stripe type separate confinement heterostructure. In addition, the first conductivity type is n-type, and the second conductivity type is p-type. That is, the semiconductor optical device in Example 1 or Example 2 or 3 described below has a multilayer structure 30 including a first compound semiconductor layer 31 having a first conductivity type (specifically, n-type in Examples), an active layer 33, and a second compound semiconductor layer 32 having a second conductivity type different from the first conductivity type (specifically, p-type in Examples).

In addition, in the semiconductor optical device in Example 1, a second electrode 42 is formed on the second compound semiconductor layer 32 through a contact layer 34, and the contact layer 34 has a thickness of four or less atomic layers. Furthermore, when an interface between the contact layer 34 and the second compound semiconductor layer 32 is an xy-plane, a lattice constant along an x-axis of crystals constituting an interface layer 32A which is a part of the second compound semiconductor layer 32 in contact with the contact layer 34 (specifically, a lattice constant along an a-axis) is $x_2$, a lattice constant along a z-axis (specifically, a lattice constant along a c-axis) is $z_2$, a length along an x-axis in one unit of crystals constituting the contact layer 34 (specifically, a length along the a-axis) is $x_c'$, and a length along the z-axis (specifically, a length along the c-axis) is $z_c'$, $(z_c'/x_c')>(z_2/x_2)$ is satisfied.

In the semiconductor optical device in Example 1 or Example 2 or 3 described below, a ridge stripe structure 20 is formed of the multilayer structure 30 having the first compound semiconductor layer 31, the active layer 33, and the second compound semiconductor layer 32 stacked, and has a first end surface 21 and a second end surface 22 facing the first end surface 21. In the example illustrated in the figure, the planar shape of the ridge stripe structure 20 is linear. In addition, the ridge stripe structure 20 is formed by partially etching the second compound semiconductor layer 32 in a thickness direction thereof. A region of the active layer 33 in a lower part of the ridge stripe structure 20 corresponds to a light emitting region (current injection region). A high-reflection coating layer (HR) is formed on each of the light emitting end surface (first end surface) 21 and the light reflecting end surface (second end surface), but the coating layer is not illustrated. Incidentally, the optical reflectance of the light emitting end surface (first end surface) 21 is lower than that of the light reflecting end surface (second end surface) 22. The ridge stripe structure 20 and both sides thereof are coated with an insulating layer 36 formed of $SiO_X$, $SiN_X$, or $AlO_X$. The insulating layer 36 on a top surface of the contact layer 34 (the second compound semiconductor layer 32 in Example 3 described below) has been removed, and the second electrode 42 is formed on the top surface of the contact layer 34 (the second compound semiconductor layer 32 in Example 3 described below). Here, in the semiconductor optical device in Example 1, the second electrode 42 is formed of a transparent conductive material containing an indium atom, specifically of ITO, Cu, Ti, Al, Ta, or the like. In addition, the first electrode 41 having Ti layer/Pt layer/Au layer stacked is formed on a back surface (surface facing a main surface) of a GaN substrate 11.

Here, in the semiconductor optical device in Example 1, a crystal structure of crystals constituting the interface layer 32A of the second compound semiconductor layer 32 is a hexagonal system. In addition, a crystal structure of crystals constituting the contact layer 34 is also a hexagonal system. The multilayer structure 30 is formed of a GaN-based compound semiconductor. The contact layer 34 is formed of a GaN-based compound semiconductor having the same composition as a GaN-based compound semiconductor constituting the interface layer 32A of the second compound semiconductor layer 32, further containing an oxygen atom. The following Table 1 indicates a specific configuration of the multilayer structure 30. A compound semiconductor layer described in the lowest column is formed on the GaN substrate 11 formed of an n-type GaN substrate. The composition of the contact layer 34 is expressed by "p-type GaN(O)". This indicates that the contact layer 34 is formed of GaN containing an oxygen atom. The active layer 33 has a quantum well structure in which a well layer formed of an InGaN layer and a barrier layer formed of a GaN layer are stacked. The GaN substrate 11 contains silicon (Si), oxygen (O), or germanium (Ge) as an n-type impurity. The semiconductor optical device having the composition indicated in Table 1 emits a green color. That is, in the semiconductor optical device in Example 1, an emission wavelength is 440 nm or more and 600 nm or less, and more specifically 495 nm or more and 570 nm or less. The interface layer 32A in the second compound semiconductor layer 32 is formed of p-type GaN constituting a second cladding layer having a superlattice structure and having a thickness of 2.5 nm. In the second cladding layer, only one of the p-type AlGaN layer and the p-type GaN layer may have a modulation doping structure. In addition, a first cladding layer or the second cladding layer may be formed of a quaternary InAlGaN layer, as described below. Incidentally, by changing the composition, a semiconductor optical device emitting a blue color can be obtained.

TABLE 1

| | | doping | thickness |
|---|---|---|---|
| contact layer 34 | p-GaN (O) | Mg | two atomic layers |
| second compound semiconductor layer 32 | | | |
| second cladding layer | p-AlGaN | Mg | 2.5 nm |
| superlattice structure | p-GaN | Mg | 2.5 nm |
| electron barrier layer | p-Al$_{0.15}$Ga$_{0.85}$N | Mg | 20 nm |
| second guide layer | InGaN | | 0.1 μm |
| active layer 33 | | | |
| well layer | In$_{0.3}$Ga$_{0.7}$N | | 3 nm two layers |
| barrier layer | GaN | | 7 nm |
| first compound semiconductor layer 31 | | | |
| first guide layer | n-InGaN | Si | 0.1 μm |
| first cladding layer | n-Al$_{0.06}$Ga$_{0.94}$N | Si | 2 μm |
| buffer layer 12 | n-GaN | Si | 0.5 μm |
| GaN substrate 11 | n-GaN | | |

Hereinafter, an outline of a method for manufacturing the semiconductor optical device in Example 1 will be described.

[Step-100]

For example, the GaN substrate 11 having a c-surface which is a {0001} plane as a main surface is prepared. However, the main surface of the GaN substrate 11 is not limited to the c-plane which is a polar plane. The GaN substrate 11 having a non-polar surface such as an A-surface which is a {11-20} plane, an M surface which is a {1-100} plane, or a {1-102} plane, or a semipolar surface such as a {11-2n} plane including a {11-24} plane and a {11-22} plane, a {10-11} plane, or a {10-12} plane as a main surface can be also used. In addition, first, the main surface of the GaN substrate 11 is cleaned by thermal cleaning or the like. Subsequently, a buffer layer 12 is subjected to crystal growth on the main surface of the GaN substrate 11 on the basis of the MOCVD method. Subsequently, a first cladding layer is grown, and then a first guide layer, an active layer, a second guide layer, an electron barrier layer, and a second cladding layer are sequentially formed. Thereafter, the contact layer 34 is formed on the basis of the ALD method to obtain the contact layer 34 formed of p-type GaN (O). The contact layer 34 is formed on the interface layer 32A formed of p-type GaN having a thickness of 2.5 nm. Incidentally, the method for forming the contact layer 34 is not limited to the ALD method.

[Step-110]

Subsequently, an etching mask is formed on the second compound semiconductor layer 32 (specifically, the contact layer 34). The ridge stripe structure 20 is formed by partially etching the second compound semiconductor layer 32 in a thickness direction thereof using this etching mask, for example, on the basis of a RIE method, and then the etching mask is removed. The second compound semiconductor layer 32 and the active layer 33 may be etched in a thickness direction thereof, or the second compound semiconductor layer 32, the active layer 33, and the first compound semiconductor layer 31 may be partially etched in a thickness direction thereof.

[Step-120]

Thereafter, the insulating layer 36 is formed on the entire surface, and the insulating layer 36 located on the top surface of the second compound semiconductor layer 32 (specifically, the contact layer 34) is removed. Then, the second electrode 42 is formed on the exposed second compound semiconductor layer 32 (specifically, the contact layer 34). In addition, for example, by lapping and polishing the back surface side of the GaN substrate 11, the GaN substrate 11 is formed into a thickness of about 100 μm, and then the first electrode 41 is formed on the back surface of the GaN substrate 11. Incidentally, a part of the second electrode 42 may be exposed by forming the second electrode 42 on the entire surface, then patterning the second electrode 42, subsequently forming the insulating layer 36 on the entire surface, and then patterning the insulating layer 36.

[Step-130]

Subsequently, the light emitting end surface (first end surface) 21 and the light reflecting end surface (second end surface) 22 are formed by cleaving the multilayer structure 30. Thereafter, a terminal or the like is formed on the basis of a known method in order to connect an electrode to an external circuit or the like, and packaging and sealing are performed to complete the semiconductor optical device in Example 1.

FIG. 2 illustrates a scanning transmission electron microscope image of the obtained semiconductor optical device. When a length along an x-axis in one unit of crystals constituting the contact layer 34 measured from the scanning transmission electron microscope image (specifically, a length along an a-axis) is $x_c'$ and a length along a z-axis (specifically, a length along a c-axis) is $z_c'$, $$x_C'/2 = 0.17 \text{ nm}$$

and $$z_C'/2 = 0.31 \text{ nm}$$

are satisfied. On the other hand, when a lattice constant along an x-axis of crystals constituting the interface layer 32A (specifically, a lattice constant along an a-axis) is $x_2$ and a lattice constant along a z-axis (specifically, a lattice constant along a c-axis) is $z_2$, $$x_2/2 = 0.17 \text{ nm}$$

and $$z_2/2 = 0.27 \text{ nm}$$

are satisfied. That is, $$(z_C'/x_C') > (z_2/x_2)$$

is satisfied. Furthermore, the contact layer 34 is pseudomorphic with respect to the interface layer 32A of the second compound semiconductor layer 32. That is, when a lattice constant along the x-axis of crystals constituting the contact layer 34 is $x_C$ and a lattice constant along the z-axis is $z_C$, $$x_2 = x_C' < x_C$$

and $$z_C' > z_C$$

are satisfied.

Figure 3:
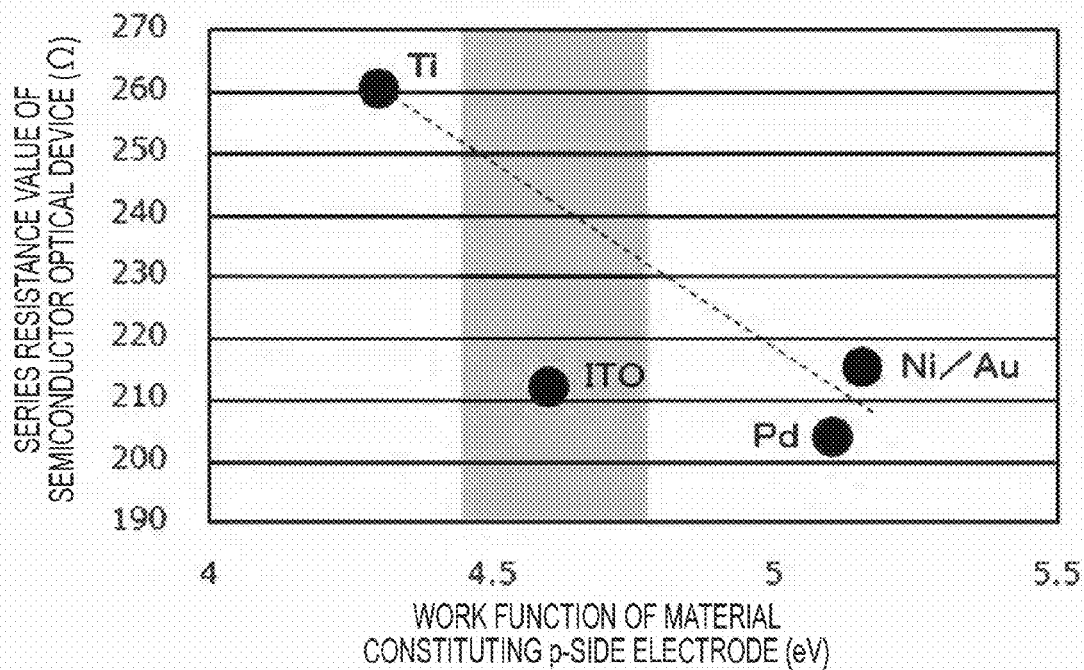
FIG. 3 is a diagram illustrating a relationship between a series resistance value of a semiconductor optical device and a work function value of a material constituting a p-side electrode.

FIG. 3 illustrates a graph of a relationship between a series resistance value of an electronic device having the structure illustrated in FIGS. 1A and 1B and a work function value of a material constituting the second electrode 42 (p-side electrode). As for Ti, Ni/Au, and Pd, series resistance values obtained when a second electrode formed of Ti, Ni/Au, or Pd is formed on a second cladding layer formed of a p-type GaN layer like a conventional semiconductor laser element are indicated. A correlation between the series resistance value and the work function value is observed. On the other hand, when the contact layer 34 in Example 1 is formed, that is, when the contact layer 34 having a thickness of two atomic layers is disposed between the interface layer 32A formed of p-type GaN and the second electrode 42 formed of ITO, an actual series resistance value is about one third of a series resistance value estimated from a work function value of ITO (for example, from 4.4 eV to 4.75 eV although depending on film-forming conditions). In addition, by reduction of the series resistance value, that is, by reduction of the contact resistance value, a driving voltage of the semiconductor optical device can be reduced.

As described above, in the semiconductor optical device in Example 1, the lattice constant in the interface layer which is a part of the second compound semiconductor layer in contact with the contact layer, and the length in one unit of crystals constituting the contact layer satisfy a predetermined relationship, and therefore a kind of distortion is generated in the contact layer. As a result, it is possible not only to reduce a driving voltage but also to form the second electrode of a material having a low work function value, such as ITO. The degree of freedom for selecting a material constituting the second electrode can be improved.

Example 2

Example 2 is a modification of Example 1. In Example 2, the multilayer structure 30 is formed of a GaN-based compound semiconductor. The contact layer 34 is formed of a GaN-based compound semiconductor having a different composition from a GaN-based compound semiconductor constituting the interface layer 32A of the second compound semiconductor layer 32. Alternatively, the multilayer structure 30 is formed of a GaN-based compound semiconductor, and the contact layer 34 is formed of one material selected from the group consisting of ZnO, ZnSe, CdO, CdS, and CdSe. Incidentally, a value of band gap energy of a compound semiconductor constituting the contact layer 34 is smaller than that of a compound semiconductor constituting the interface layer 32A of the second compound semiconductor layer 32 (GaN: 3.4 eV). As a GaN-based compound semiconductor having a different composition from the GaN-based compound semiconductor (specifically, GaN) constituting the interface layer 32A of the second compound semiconductor layer 32, examples of the configuration of the contact layer 34 include:

(a) $Al_X Ga_Y In_Z N$ (provided that $X+Y+Z=1$, $0 \leq X \leq 1$, $0 \leq Y \leq 1$, and $0 \leq Z \leq 1$);

(b) $Al_X Ga_Y In_Z N_S O_T$ (provided that $X+Y+Z=1$, $0 \leq X \leq 1$, $0 \leq Y \leq 1$, $0 \leq Z \leq 1$, $0 < S \leq 1$, and $0 < T \leq 1$);

(c) $Al_X Ga_Y In_Z N_S P_{1-S}$ (provided that $X+Y+Z=1$, $0 \leq X \leq 1$, $0 \leq Y \leq 1$, $0 \leq Z \leq 1$, and $0 \leq S < 1$);

(d) $Al_X Ga_Y In_Z N_S As_{1-S}$ (provided that $X+Y+Z=1$, $0 \leq X \leq 1$, $0 \leq Y \leq 1$, $0 \leq Z \leq 1$, and $0 \leq S < 1$); and (e) $Al_X Ga_Y In_Z N_S Sb_{1-S}$ (provided that $X+Y+Z=1$, $0 \leq X \leq 1$, $0 \leq Y \leq 1$, $0 \leq Z \leq 1$, and $0 \leq S < 1$). Incidentally, each of values of band gap energy of these materials is, for example, 3.3 eV, which is smaller than 3.4 eV.

Also in the contact layer 34 in the semiconductor optical device in Example 2 described above, $$(z_C'/x_C') > (z_2/x_2)$$

is satisfied. Furthermore, the contact layer 34 is pseudomorphic with respect to the interface layer 32A of the second compound semiconductor layer 32. That is, when a lattice constant along the x-axis of crystals constituting the contact layer 34 is $x_C$ and a lattice constant along the z-axis is $z_C$, $$x_2 = x_C' < x_C$$

and $$z_C' > z_C$$

are satisfied. In addition, when the contact layer 34 having a thickness of two atomic layers is disposed between the interface layer 32A formed of p-type GaN and the second electrode 42 formed of ITO, a series resistance value of the semiconductor optical device in Example 2 is about one third of a series resistance value estimated from a work function value of ITO.

That is, as described above, also in the semiconductor optical device in Example 2, the lattice constant in the interface layer which is a part of the second compound semiconductor layer in contact with the contact layer, and the length in one unit of crystals constituting the contact layer satisfy a predetermined relationship, and therefore a kind of distortion is generated in the contact layer. As a result, it is possible not only to reduce a driving voltage but also to form the second electrode of a material having a low work function value, such as ITO. The degree of freedom for selecting a material constituting the second electrode can be improved.

Example 3

Figure 4:
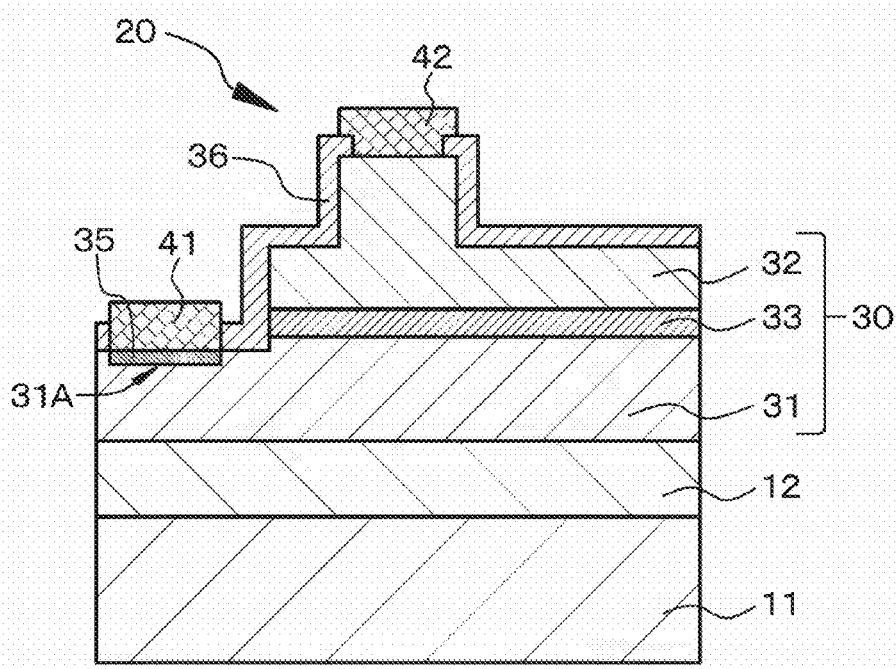
FIG. 4 is a schematic partial cross sectional view of a semiconductor optical device in Example 3.
Figure 5:
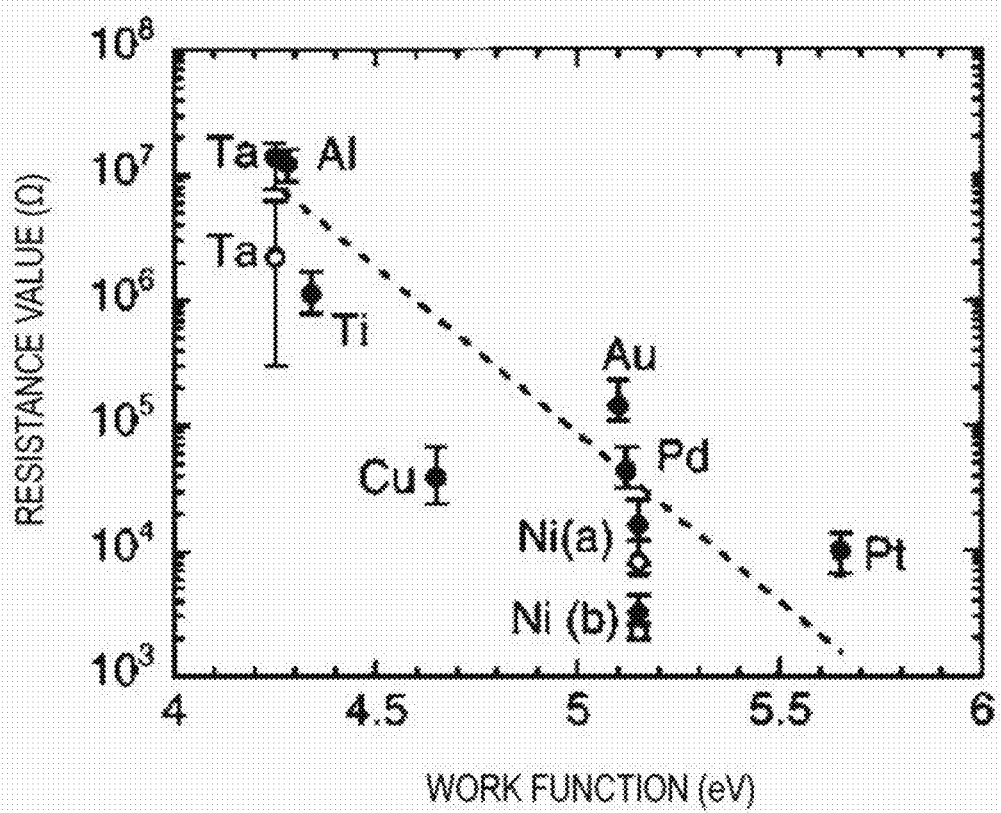
FIG. 5 is a diagram illustrating a relationship between a second electrode formed on a second compound semiconductor layer formed of p-type GaN and a resistance value.

Example 3 relates to a semiconductor optical device according to the second aspect of the present disclosure. FIG. 4 illustrates a schematic partial cross sectional view of the semiconductor optical device in Example 3. Incidentally, FIG. 4 is a schematic partial cross sectional view similar to the case where the device is cut along the arrow A-A in FIG. 1B, and is a schematic partial cross sectional view obtained by cutting the semiconductor optical device at a virtual plane perpendicular to a direction in which a waveguide structure (resonator structure) extends.

In the semiconductor optical device in Example 3, the first electrode 41 is formed on the first compound semiconductor layer 31 through a contact layer 35. The contact layer 35 has a thickness of four or less atomic layers. When an interface between the contact layer 35 and the first compound semiconductor layer 31 is an xy-plane, a lattice constant along an x-axis of crystals constituting an interface layer 31A which is a part of the first compound semiconductor layer 31 in contact with the contact layer 35 is $x_1$, a lattice constant along a z-axis is $z_1$, a length along the x-axis in one unit of crystals constituting the contact layer 35 is $x_c''$, and a length along the z axis is $z_c''$, $$(z_c''/x_c'') > (z_1/x_1)$$

is satisfied.

The ridge stripe structure 20 has a structure and a configuration similar to the ridge stripe structure 20 in the semiconductor optical device in Example 1. Here, in Example 3, the second electrode 42 is formed of Pd, Au, or the like, and the first electrode 41 is formed of ITO, Cu, Ti, Al, Ta, or the like.

Here, a crystal structure of crystals constituting the interface layer 31A of the first compound semiconductor layer 31 is a hexagonal system. In addition, a crystal structure of crystals constituting the contact layer 35 is also a hexagonal system. The multilayer structure 30 is formed of a GaN-based compound semiconductor. The contact layer 35 is formed of a GaN-based compound semiconductor having the same composition as a GaN-based compound semiconductor constituting the interface layer 31A of the first compound semiconductor layer 31, further containing an oxygen atom. The composition of the multilayer structure 30 is similar to that indicated in the above Table 1. Alternatively, the multilayer structure 30 is formed of a GaN-based compound semiconductor, and the contact layer 35 is formed of a GaN-based compound semiconductor having a different composition from a GaN-based compound semiconductor constituting the interface layer 31A of the first compound semiconductor layer 31.

In the semiconductor optical device in Example 3, in the method for manufacturing the semiconductor optical device in Example 1, steps similar to [step-100] and [step-110] are performed except formation of the contact layer 34 in [step-100], the insulating layer 36 is formed on the entire surface in a step similar to [step-120], and the insulating layer 36 located on the top surface of the second compound semiconductor layer 32 is removed. Then, the second electrode 42 is formed on the exposed second compound semiconductor layer 32. Alternatively, the second electrode 42 is formed on the entire surface, and the second electrode 42 located on the top surface of the second compound semiconductor layer 32 is left. Then, the insulating layer 36 is formed on the entire surface, and then a part of the insulating layer 36 may be removed to expose a part of the second electrode 42. Thereafter, a part of the insulating layer 36 on the first compound semiconductor layer 31 is removed to expose a part of the first compound semiconductor layer 31, and the contact layer 35 and the first electrode 41 are formed on the exposed first compound semiconductor layer 31 to obtain the structure illustrated in FIG. 4. Thereafter, it is only required to perform a step similar to [step-130] in Example 1.

Also in the contact layer 35 in the semiconductor optical device in Example 3 described above, $$(z_C''/x_C'') > (z_1/x_1)$$

is satisfied. Furthermore, the contact layer 35 is pseudomorphic with respect to the interface layer 31A of the first compound semiconductor layer 31. That is, when a lattice constant along an x-axis of crystals constituting the contact layer 35 is $x_C$ and a lattice constant along a z-axis is $z_C$, $$x_1 = x_C'' < x_C$$

and $$z_C'' > z_C$$

are satisfied. In addition, the contact layer 35 having a thickness of two atomic layers is disposed between the interface layer 31A and the first electrode 41. Therefore, a series resistance value of the semiconductor optical device in Example 3 is a sufficiently small value.

That is, as described above, also in the semiconductor optical device in Example 3, the lattice constant in the interface layer which is a part of the first compound semiconductor layer in contact with the contact layer, and the length in one unit of crystals constituting the contact layer satisfy a predetermined relationship, and therefore a kind of distortion is generated in the contact layer. As a result, it is possible to further reduce a contact resistance value.

Hitherto, the present disclosure has been described on the basis of preferable Examples. However, the present disclosure is not limited to these Examples. The configurations of the semiconductor optical devices or the display devices, the structures thereof, and the methods for manufacturing a semiconductor optical device, described in Examples, are illustrative, and can be modified appropriately. The semiconductor optical device described in Examples 1 and 2 can be combined with the semiconductor optical device described in Example 3. In Examples, the semiconductor optical device has been described exclusively as a semiconductor laser element. However, in addition, the semiconductor optical device can be a semiconductor light emitting element such as a super luminescent diode (SLD), a surface emitting laser element, or a light emitting diode (LED), a semiconductor light amplifier, a solar cell, or a light sensor.

In addition, in Examples, the ridge stripe structure 20 has a shape extending linearly, but is not limited thereto. The shape is not limited to a shape extending at a constant width, but may be a tapered shape or a flared shape. Specifically, for example, the shape can be a configuration in which the shape is gradually widened monotonically in a tapered shape from a light emitting end surface toward a light reflecting end surface, or a configuration in which the shape is first widened from a light emitting end surface toward a light reflecting end surface, and then is narrowed after the width becomes larger than a maximum width.

Furthermore, the semiconductor laser element can have a diagonal ridge stripe type separate confinement heterostructure with a diagonal waveguide. For example, such a semiconductor laser element has a structure obtained by combining two linear ridge stripe structures. A value of a cross angle φ between the two ridge stripe structures satisfies, for example, 0<φ≤10 (degrees), preferably 0<φ≤6 (degrees).

By employing the diagonal ridge stripe type, a reflectance on the non-reflection coated light emitting end surface can be made closer to an ideal value of 0%. As a result, generation of laser light circulating in a semiconductor laser element can be prevented, and generation of secondary induced emission light accompanying main induced emission light can be suppressed advantageously.

Incidentally, the present disclosure can have the following configurations.

[A01]<<Semiconductor Optical Device: First Aspect>>

A semiconductor optical device having a multilayer structure including a first compound semiconductor layer having a first conductivity type, an active layer, and a second compound semiconductor layer having a second conductivity type different from the first conductivity type, in which a second electrode is formed on the second compound semiconductor layer through a contact layer, the contact layer has a thickness of four or less atomic layers, and when an interface between the contact layer and the second compound semiconductor layer is an xy-plane, a lattice constant along an x-axis of crystals constituting an interface layer which is a part of the second compound semiconductor layer in contact with the contact layer is $x_2$, a lattice constant along a z-axis is $z_2$, a length along the x-axis in one unit of crystals constituting the contact layer is $x_c'$, and a length along the z-axis is $z_c'$, $$(z_c'/x_c') > (z_2/x_2)$$

is satisfied.

[A02] The semiconductor optical device described in [A01], in which the contact layer is pseudomorphic with respect to the interface layer of the second compound semiconductor layer.

[A03] The semiconductor optical device described in [A02], in which when a lattice constant along the x-axis of crystals constituting the contact layer is $x_c$ and a lattice constant along the z-axis is $z_C$, $$x_2 = x_C' < x_C$$

and $$z_C' > z_C$$

are satisfied.

[A04] The semiconductor optical device described in any one of [A01] to [A03], in which a crystal structure of crystals constituting the interface layer of the second compound semiconductor layer is a hexagonal system.

[A05] The semiconductor optical device described in [A04], in which the multilayer structure is formed of a GaN-based compound semiconductor, and the contact layer is formed of a GaN-based compound semiconductor having the same composition as a GaN-based compound semiconductor constituting the second compound semiconductor layer, further containing an oxygen atom.

[A06] The semiconductor optical device described in [A04], in which the multilayer structure is formed of a GaN-based compound semiconductor, and the contact layer is formed of a GaN-based compound semiconductor having a different composition from a GaN-based compound semiconductor constituting the second compound semiconductor layer.

[A07] The semiconductor optical device described in any one of [A01] to [A03], in which the multilayer structure is formed of a GaN-based compound semiconductor, and the contact layer is formed of one material selected from the group consisting of ZnO, ZnSe, CdO, CdS, and CdSe.

[A08] The semiconductor optical device described in any one of [A01] to [A07], in which a value of band gap energy of a compound semiconductor constituting the contact layer is smaller than that of a compound semiconductor constituting the interface layer of the second compound semiconductor layer.

[A09] The semiconductor optical device described in any one of [A01] to [A08], in which the second electrode is formed of a transparent conductive material containing an indium atom.

[A10] The semiconductor optical device described in any one of [A01] to [A09], in which the first conductivity type is n-type, and the second conductivity type is p-type.

[B01] The semiconductor optical device described in any one of [A01] to [A10], in which a first electrode is formed on the first compound semiconductor layer through a second contact layer, the second contact layer has a thickness of four or less atomic layers, and when an interface between the second contact layer and the first compound semiconductor layer is an xy-plane, a lattice constant along an x-axis of crystals constituting an interface layer which is a part of the first compound semiconductor layer in contact with the second contact layer is $x_1$, a lattice constant along a z-axis is $z_1$, a length along the x-axis in one unit of crystals constituting the second contact layer is $x_c''$, and a length along the z axis is $z_c''$, $$(z_c''/x_c'') > (z_1/x_1)$$

is satisfied.

[B02] The semiconductor optical device described in [B01], in which the second contact layer is pseudomorphic with respect to the interface layer of the first compound semiconductor layer.

[B03] The semiconductor optical device described in [B02], in which when a lattice constant along the x-axis of crystals constituting the second contact layer is $x_c$ and a lattice constant along the z-axis is $z_C$, $$x_1 = x_C'' < x_C$$

and $$z_C'' > z_C$$

are satisfied.

[B04] The semiconductor optical device described in any one of [B01] to [B03], in which a crystal structure of crystals constituting the interface layer of the first compound semiconductor layer is a hexagonal system.

[B05] The semiconductor optical device described in [B04], in which the second contact layer is formed of a GaN-based compound semiconductor having the same composition as a GaN-based compound semiconductor constituting the first compound semiconductor layer, further containing an oxygen atom.

[B06] The semiconductor optical device described in [B04], in which the second contact layer is formed of a GaN-based compound semiconductor having a different composition from a GaN-based compound semiconductor constituting the first compound semiconductor layer.

[B07] The semiconductor optical device described in any one of [B01] to [B03], in which the second contact layer is formed of one material selected from the group consisting of ZnO, ZnSe, CdO, CdS, and CdSe.

[B08] The semiconductor optical device described in any one of [B01] to [B07], in which a value of band gap energy of a compound semiconductor constituting the second contact layer is smaller than that of a compound semiconductor constituting the interface layer of the first compound semiconductor layer.

[C01] <<Semiconductor Optical Device: Second Aspect>>

A semiconductor optical device having a multilayer structure including a first compound semiconductor layer having a first conductivity type, an active layer, and a second compound semiconductor layer having a second conductivity type different from the first conductivity type, in which a first electrode is formed on the first compound semiconductor layer through a contact layer, the contact layer has a thickness of four or less atomic layers, and when an interface between the contact layer and the first compound semiconductor layer is an xy-plane, a lattice constant along an x-axis of crystals constituting an interface layer which is a part of the first compound semiconductor layer in contact with the contact layer is $x_1$, a lattice constant along a z-axis is $z_1$, a length along the x-axis in one unit of crystals constituting the contact layer is $x_c''$, and a length along the z-axis is $z_c''$, $$(z_c''/x_c'') > (z_1/x_1)$$

is satisfied.

[C02] The semiconductor optical device described in [C01], in which the contact layer is pseudomorphic with respect to the interface layer of the first compound semiconductor layer.

[C03] The semiconductor optical device described in [C02], in which when a lattice constant along the x-axis of crystals constituting the contact layer is $x_c$ and a lattice constant along the z-axis is $z_C$, $$x_1 = x_C'' < x_C$$

and $$z_C'' > z_C$$

are satisfied.

[C04] The semiconductor optical device described in any one of [C01] to [C03], in which a crystal structure of crystals constituting the interface layer of the first compound semiconductor layer is a hexagonal system.

[C05] The semiconductor optical device described in [C04], in which the multilayer structure is formed of a GaN-based compound semiconductor, and the contact layer is formed of a GaN-based compound semiconductor having the same composition as a GaN-based compound semiconductor constituting the first compound semiconductor layer, further containing an oxygen atom.

[C06] The semiconductor optical device described in [C04], in which the multilayer structure is formed of a GaN-based compound semiconductor, and the contact layer is formed of a GaN-based compound semiconductor having a different composition from a GaN-based compound semiconductor constituting the first compound semiconductor layer.

[C07] The semiconductor optical device described in any one of [C01] to [C03], in which the multilayer structure is formed of a GaN-based compound semiconductor, and the contact layer is formed of one material selected from the group consisting of ZnO, ZnSe, CdO, CdS, and CdSe.

[C08] The semiconductor optical device described in any one of [C01] to [C07], in which a value of band gap energy of a compound semiconductor constituting the contact layer is smaller than that of a compound semiconductor constituting the interface layer of the first compound semiconductor layer.

[C09] The semiconductor optical device described in any one of [C01] to [C08], in which the first conductivity type is n-type, and the second conductivity type is p-type.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

11 GaN substrate
12 buffer layer
20 ridge stripe structure
21 light emitting end surface (first end surface)
22 light reflecting end surface (second end surface)
30 multilayer structure
31 first compound semiconductor layer
31A interface layer of first compound semiconductor layer
32 second compound semiconductor layer
32A interface layer of second compound semiconductor layer
33 active layer
34, 35 contact layer
36 insulating layer
41 first electrode
42 second electrode

The invention claimed is:

1. A semiconductor optical device having a multilayer structure including a first compound semiconductor layer having a first conductivity type, an active layer, and a second compound semiconductor layer having a second conductivity type different from the first conductivity type, wherein
    a second electrode is formed on the second compound semiconductor layer through a contact layer,
    the contact layer has a thickness of four or less atomic layers, and
    when an interface between the contact layer and the second compound semiconductor layer is an xy-plane, a lattice constant along an x-axis of crystals constituting an interface layer which is a part of the second compound semiconductor layer in contact with the contact layer is $x_2$, a lattice constant along a z-axis is $z_2$, a length along the x-axis in one unit of crystals constituting the contact layer is $x_c'$, and a length along the z-axis is $z_c'$, $$(z_c'/x_c') > (z_2/x_2)$$

is satisfied.

2. The semiconductor optical device according to claim 1, wherein the contact layer is pseudomorphic with respect to the interface layer of the second compound semiconductor layer.

3. The semiconductor optical device according to claim 2, wherein
    when a lattice constant along an x-axis of crystals constituting the contact layer is $x_c$ and a lattice constant along a z-axis is $z_C$, $$x_2 = x_C' < x_C$$

and $$z_C' > z_C$$

are satisfied.

4. The semiconductor optical device according to claim 1, wherein a crystal structure of crystals constituting the interface layer of the second compound semiconductor layer is a hexagonal system.

5. The semiconductor optical device according to claim 4, wherein
    the multilayer structure is formed of a GaN-based compound semiconductor, and
    the contact layer is formed of a GaN-based compound semiconductor having the same composition as a GaN-based compound semiconductor constituting the second compound semiconductor layer, further containing an oxygen atom.

6. The semiconductor optical device according to claim 4, wherein
    the multilayer structure is formed of a GaN-based compound semiconductor, and
    the contact layer is formed of a GaN-based compound semiconductor having a different composition from a GaN-based compound semiconductor constituting the second compound semiconductor layer.

7. The semiconductor optical device according to claim 1, wherein
    the multilayer structure is formed of a GaN-based compound semiconductor, and
    the contact layer is formed of one material selected from the group consisting of ZnO, ZnSe, CdO, CdS, and CdSe.

8. The semiconductor optical device according to claim 1, wherein a value of band gap energy of a compound semiconductor constituting the contact layer is smaller than that of a compound semiconductor constituting the interface layer of the second compound semiconductor layer.

9. The semiconductor optical device according to claim 1, wherein the second electrode is formed of a transparent conductive material containing an indium atom.

10. The semiconductor optical device according to claim 1, wherein the first conductivity type is n-type, and the second conductivity type is p-type.

* * * * *